United States Patent
Yoo et al.

(10) Patent No.: US 10,364,494 B2
(45) Date of Patent: Jul. 30, 2019

(54) SUBSTRATE PROCESSING APPARATUS

(71) Applicant: EUGENE TECHNOLOGY CO., LTD., Yongin-Si, Gyeonggi-Do (KR)

(72) Inventors: Cha Young Yoo, Suwon-Si (KR); Sung Tae Je, Yongin-Si (KR); Kyu Jin Choi, Yongin-Si (KR); Ja Dae Ku, Suwon-Si (KR); Jun Kim, Yongin-Si (KR); Bong Ju Jung, Hwaseong-Si (KR); Kyung Seok Park, Hwaseong-Si (KR); Yong Ki Kim, Osan-Si (KR); Jae Woo Kim, Bucheon-Si (KR)

(73) Assignee: EUGENE TECHNOLOGY CO., LTD. (KR)

(*) Notice: Subject to any disclaimer, the term of this patent is extended or adjusted under 35 U.S.C. 154(b) by 201 days.

(21) Appl. No.: 15/289,899

(22) Filed: Oct. 10, 2016

(65) Prior Publication Data
US 2017/0183771 A1 Jun. 29, 2017

(30) Foreign Application Priority Data
Dec. 28, 2015 (KR) .................. 10-2015-0187865

(51) Int. Cl.
*C23C 16/40* (2006.01)
*C23C 16/455* (2006.01)
(Continued)

(52) U.S. Cl.
CPC ........ *C23C 16/455* (2013.01); *C23C 16/4584* (2013.01); *C23C 16/46* (2013.01);
(Continued)

(58) Field of Classification Search
CPC ... C23C 16/455; C23C 16/52; C23C 16/4584; C23C 16/46; C30B 29/06; C30B 25/10; H01L 21/67109
(Continued)

(56) References Cited

U.S. PATENT DOCUMENTS 6,369,361 B2 * 4/2002 Saito .................. C30B 31/12
                                                   118/50.1
7,027,722 B2 * 4/2006 Uemori .............. H01L 21/67109
                                                   118/50.1
(Continued)

FOREIGN PATENT DOCUMENTS

CN  1620714 A  5/2005
CN  1685476 A  10/2005
(Continued)

*Primary Examiner* — Rudy Zervigon
(74) *Attorney, Agent, or Firm* — Renaissance IP Law Group LLP (57) ABSTRACT

The present disclosure relates to a substrate processing apparatus, and more particularly, a substrate processing apparatus that is capable of improving process uniformity on an entire surface of a substrate. The substrate processing apparatus includes a substrate boat in which a substrate is loaded, a reaction tube in which a processing process for the substrate loaded in the substrate boat is performed, a gas supply unit configured to supply a process gas into the reaction tube through an injection nozzle disposed on one side of the reaction tube, a heating unit including a plurality of vertical heating parts, which are disposed along a circumference of the reaction tube outside the reaction tube and configured to divide the circumference to the reaction tube into a plurality of portions so as to independently heat each of the divided portions of the reaction tube, and a control unit configured to control the heating unit.

13 Claims, 4 Drawing Sheets

(51) Int. Cl.
*C23C 16/458* (2006.01)
*C23C 16/46* (2006.01)
*C23C 16/52* (2006.01)
*C30B 25/10* (2006.01)
*C30B 29/06* (2006.01)
*H01L 21/67* (2006.01)

(52) U.S. Cl.
CPC .............. *C23C 16/52* (2013.01); *C30B 25/10* (2013.01); *C30B 29/06* (2013.01); *H01L 21/67109* (2013.01)

(58) Field of Classification Search
USPC ..................... 118/724, 725, 663; 156/345.52
See application file for complete search history.

(56) References Cited

U.S. PATENT DOCUMENTS

| | | | |
|---|---|---|---|
| 2007/0166656 A1* | 7/2007 | Jang | F27B 5/04 432/247 |
| 2008/0153314 A1 | 6/2008 | Hayashida et al. | |
| 2009/0311807 A1* | 12/2009 | Yamaga | H01L 21/67109 438/5 |

FOREIGN PATENT DOCUMENTS

| | | |
|---|---|---|
| CN | 101604623 A | 12/2009 |
| CN | 104064497 A | 9/2014 |
| CN | 105518835 A | 4/2016 |
| JP | 2008166321 A | 7/2008 |
| JP | 2008172204 A | 7/2008 |
| JP | 2012114327 A | 6/2012 |
| JP | 2014165500 A | 9/2014 |
| JP | 2014207435 A | 10/2014 |
| KR | 20050088989 A | 9/2005 |
| KR | 101396602 B1 | 5/2014 |
| KR | 20140099210 A | 8/2014 |
| TW | 200710932 A | 3/2007 |
| TW | 200741875 A | 11/2007 |
| TW | I311340 B | 6/2009 |
| TW | 201513226 A | 4/2015 |
| TW | 201542875 A | 11/2015 |
| TW | 201546316 A | 12/2015 |
| WO | 2015016180 A1 | 2/2015 |

* cited by examiner

SUBSTRATE PROCESSING APPARATUS

CROSS-REFERENCE TO RELATED APPLICATION

This application claims priority to Korean Patent Application No. 10-2015-0187865 filed on Dec. 28, 2015 and all the benefits accruing therefrom under 35 U.S.C. § 119, the contents of which are incorporated by reference in their entirety.

BACKGROUND

The present disclosure relates to a substrate processing apparatus, and more particularly, to a substrate processing apparatus that is capable of improving process uniformity on an entire surface of a substrate.

In general, substrate processing apparatuses are classified into single wafer type substrate processing apparatuses capable of processing one substrate and batch type substrate processing apparatuses capable of processing a plurality of substrates at the same time. Such a single wafer type substrate processing apparatus has a simple structure, but has low productivity. Thus, the batch type substrate processing apparatuses capable of being mass-producing substrates are being widely used.

A substrate processing apparatus may perform a substrate processing process on one or plural substrates at an increased temperature. In such a batch type substrate processing apparatus in which a plurality of substrates are loaded in multi stages, it is necessary to uniformly heat the vertically stacked substrates so that the processing process is uniformly performed on all the substrates. Since a heating unit uniformly heats the entire region at the outside of a reaction tube in the typical substrate processing apparatus, each of upper and lower portions may have a temperature less than that of an intermediate portion due to a difference in temperature between the upper and lower portions and the surrounding portion.

To solve this limitation, a method in which the heating unit may be divided in multi stages to separately control each stage is being used.

Although the above-described method is capable of solving non-uniformity of the substrates, it may be difficult to improve uniformity on an entire surface of each of the substrates. To improve the uniformity on the entire surface of the substrate, it is important to control a temperature of the heating unit. However, the typical substrate processing apparatus uses a method in which the heating unit uniformly heats the circumference of the reaction tube. In this method, a temperature in an injection nozzle region may be different from those in other regions due to the influence of a process gas temperature to cause non-uniformity in the processing process. When the reaction tube has a uniform temperature in the entire inner region thereof, a gas partial pressure in the injection nozzle region may be relatively high to cause a limitation in which a portion of the substrate approaching an injection nozzle is more processed than other portions of the substrate (e.g., a layer grown on the portion of the substrate approaching the injection nozzle has a relatively thick thickness).

PRIOR ART DOCUMENTS

Patent Documents

Korean Patent Publication No. 10-2014-0099210

SUMMARY

The present disclosure provides a substrate processing apparatus in which a plurality of vertical heating parts are independently controlled to improve process uniformity on an entire surface of a substrate.

In accordance with an exemplary embodiment, a substrate processing apparatus includes: a substrate boat in which a substrate is loaded; a reaction tube in which a processing process for the substrate loaded in the substrate boat is performed; a gas supply unit configured to supply a process gas into the reaction tube through an injection nozzle disposed on one side of the reaction tube; a heating unit including a plurality of vertical heating parts, which are disposed along a circumference of the reaction tube outside the reaction tube and configured to divide the circumference to the reaction tube into a plurality of portions so as to independently heat each of the divided portions of the reaction tube; and a control unit configured to control the heating unit.

The plurality of vertical hating parts may include: a first vertical heating part disposed at a position corresponding to the injection nozzle; and a second vertical heating part extending along the circumference of the reaction tube from the first vertical heating part and disposed on at least a portion of the circumference of the reaction tube.

The first vertical heating part may have a horizontal cross-sectional area less than that of the second vertical heating part.

The first vertical heating part may have a heating temperature corresponding to a range from 90% to 110% of a heating temperature of the second vertical heating part.

The control unit may include: a first control part connected to the first vertical heating part; and a second control part connected to the second vertical heating part, wherein the first vertical heating part and the second vertical heating part may be independently controlled.

The first control part may include a first temperature measuring member configured to measure a temperature of the first vertical heating part, and the second control part may include a second temperature measuring member configured to measure a temperature of the second vertical heating part and a third temperature measuring member configured to measure an inner temperature of the reaction tube.

The first control part may control the first vertical heating part by using a measured value of the first temperature measuring member, and the second control part may controls the second vertical heating part by using a value calculated by a measured value of the second temperature measuring member and a measured value of the third temperature measuring member.

The plurality of vertical heating parts may be formed by stacking a plurality of horizontal heating elements that are independently controlled.

The substrate processing apparatus may further include a rotation driving unit configured to rotate the substrate boat.

The substrate processing apparatus may further include an exhaust unit exhausting residual gases within the reaction tube by being disposed on the other side of the reaction tube, which is symmetrical to the injection nozzle, wherein the plurality of vertical heating part may further include a third vertical heating part disposed symmetrical to the first vertical heating part at a position corresponding to the exhaust unit.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the descriptions, the same elements are denoted with the same reference numerals. In the figures, the dimensions of layers and regions are exaggerated for clarity of illustration. Like reference numerals refer to like elements throughout.

Figure 1:
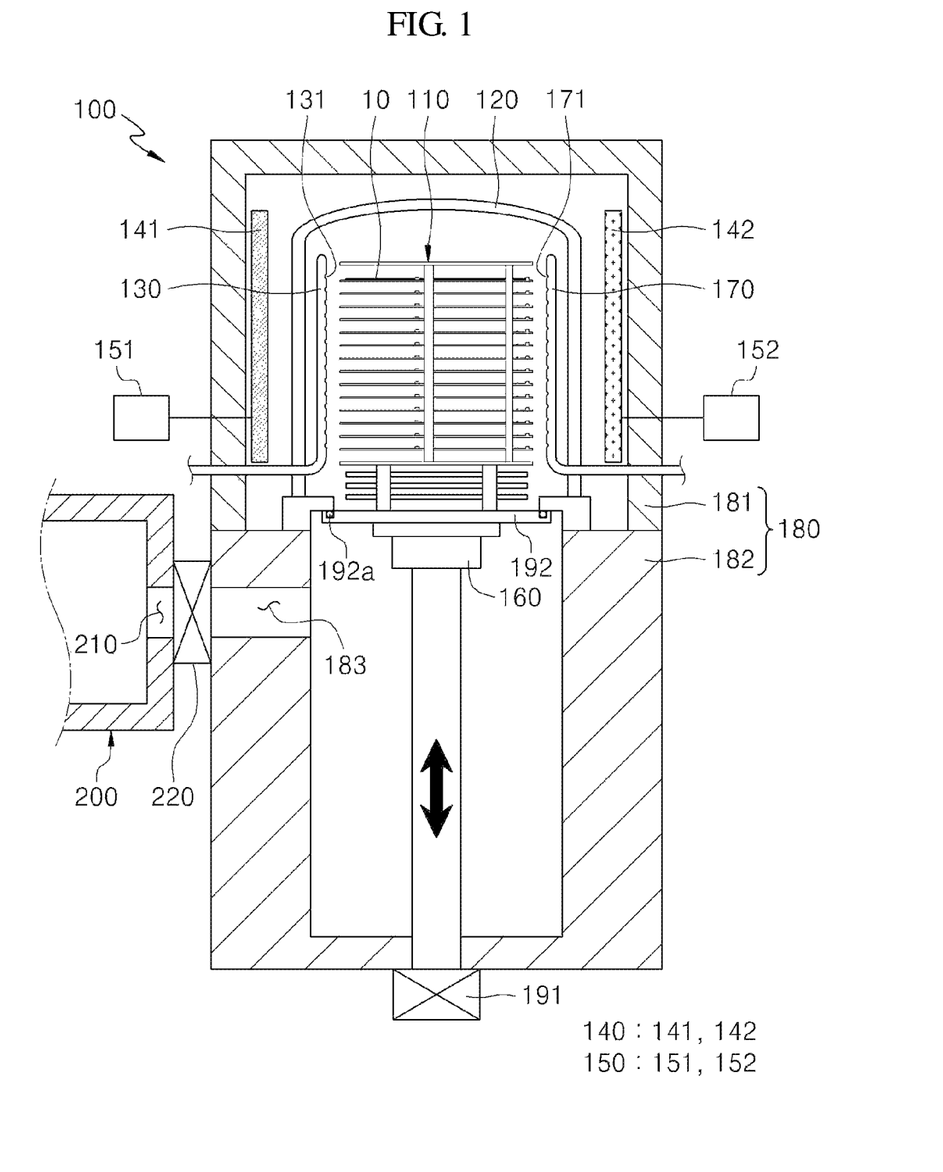
FIG. 1 is a cross-sectional view of a substrate processing apparatus in accordance with an exemplary embodiment.

FIG. 1 is a cross-sectional view of a substrate processing apparatus in accordance with an exemplary embodiment.

Referring to FIG. 1, a substrate processing apparatus 100 in accordance with an exemplary embodiment may include a substrate boat 110 on which a substrate 10 is loaded, a reaction tube 120 in which a process of processing the substrate 10 loaded into the substrate boat 110 is performed, a gas supply unit 130 supplying a process gas into the reaction tube 120 through an injection nozzle 131 provided in one side of the reaction tube 120, a heating unit 140 constituted by a plurality of vertical heating parts 141 and 142 provided along a circumference of the reaction tube 120 outside the reaction tube 120 to divide the circumference of the reaction tube 120 and thus independently heat the divided portions of the reaction tube 120, and a control unit 150 controlling the heating unit 140.

One substrate or a plurality of substrates may be loaded into the substrate boat 110. Thus, a batch type substrate processing apparatus in which a substrate processing process is performed on the plurality of substrates may be provided. The plurality of substrates 10 may be loaded into the substrate boat 110 in multi stages (or a vertical direction) so as to perform the substrate processing process in a batch type manner. The substrate boat 110 may be elevated to load the substrates or perform the processing process. For example, the substrate boat 110 may load 22 sheets of substrates 10 in multi stage. While the substrate boat 110 is positioned in a loading space (or at a loading position) provided in a lower chamber 162, the substrate 10 may be loaded into the substrate boat 110. In more detail, when one substrate 10 is loaded on one stage of the substrate boat 110, the substrate boat 110 may ascend to allow the substrate 10 to be loaded on a stage disposed below the stage on which the substrate 10 is loaded. When the plurality of substrates 10 are completely loaded into the substrate boat 110, the substrate boat 110 may move to an accommodation space (or the process position) of the reaction tube 120 so that the substrate processing process is performed in the accommodation space of the reaction tube 120.

Also, the substrate boat 110 may include a plurality of partition plates partitioning the loading space in which the substrate 10 is loaded. The plurality of partition plates may define a plurality of individual loading spaces in which the plurality of substrates 10 are respectively loaded so that the plurality of substrates 10 are individually processed in each of the loading spaces. That is, the substrate boat 110 may have multi-stage loading spaces in a vertical direction, and one substrate 10 may be loaded in each of the loading spaces. Thus, the regions for processing the substrate 10 may be individually defined in the loading space of the substrate boat 110 to prevent the process gas injected onto each of the substrates 10 from having an influence on upper and lower substrates. Ceramic, quartz, synthesis quartz, and the like may be used as a material of each of the partition plates.

In the batch type substrate processing apparatus in accordance with the related art, the plurality of substrates may be vertically stacked in a single space to perform a substrate processing process. As a result, particles attached to a bottom surface of the substrate may be separated from an end-effector of a transfer module in a single wafer type process or other processes before the substrate processing process to drop onto a layer formation surface of the lower substrate while carrying or taking out the substrate or during the process, thereby acting as an effect that deteriorates quality of a layer to be grown (hereinafter, referred to as a grown layer).

However, in the substrate processing apparatus 100 in accordance with an exemplary embodiment, the substrate boat 110 including the plurality of partition plates may be used to independently separate the plurality of substrates 10, thereby preventing particles attached to a bottom surface of the substrate 10 from dropping onto a layer formation surface of a lower substrate and thus preventing a grown layer from being deteriorated in quality.

Also, since the batch type substrate processing apparatus in accordance with the related art includes one process gas supply line, only an amount of process gas supplied into the reaction tube may be controlled, but an amount of process gas supplied onto each of the substrates may not be individually controlled. That is, a concentration of the process gas supplied onto each of the substrates is not controlled. As a result, the grown layer formed on the substrate may not be controlled in thickness to form substrates having thicknesses different from each other. Also, to solve this limitation, although a system in which a multi-stage gas supply nozzle and a gas exhaust hole are provided to independently supply a gas to each of the substrates is provided, since the substrate boat has an opened structure between the substrates, the substrate processing may not be performed on the plurality of substrates within the substrate boat. That is, even though a predetermined amount of process gas is supplied through the gas supply nozzle (or the injection nozzle) corresponding to each of the substrates, the process gas may have an influence on a substrate disposed at a corresponding position and substrates disposed above and below the substrate disposed on the corresponding position. Thus, the plurality of substrates within the substrate boat may not be uniformly processed.

However, in the substrate boat 110 in accordance with an exemplary embodiment, the partition plates may be installed between the substrates 10 to independently separate the plurality of substrates 10 to prevent the process gas injected onto each of the substrates 10 from having an influence on the upper and lower substrates.

Also, the substrate boat 110 may further include a connection bar supporting the partition plates. The connection bar may be provided in plurality. Thus, a plurality of insertion grooves into which the plurality of partition plates are inserted may be defined in the plurality of connection bars. Here, the plurality of insertion grooves may be vertically defined in each of the connection bars, and the plurality of partition plates may be respectively inserted into and coupled to the insertion grooves. In this case, a distance (or height) between the partition plates may be simply adjusted through a simple method in which the partition plates are inserted into and withdrawn from the insertion grooves.

The connection bar may connect the plurality of partition plates to each other. While the connection bar stably supports the plurality of partition plates to perform the substrate processing process, the connection bar may prevent the plurality of partition plates from being tilted and each of the loading spaces from being deformed. Also, the plurality of connection bars may be integrally coupled to components of the substrate boat 110 such as the plurality of partition plates.

Also, the plurality of connection bars may be symmetrically disposed in a carrying direction (loading direction) of the substrate 10. The plurality of connection bars may be symmetrically disposed to stably support the plurality of partition plates and the substrate 10. When the connection bar covers the carrying diction of the substrate 10, since interference occurs when the substrate 10 is loaded (carried), and the substrate 10 is not loaded, the connection bars may be symmetrically disposed with respect to the carrying direction of the substrate 10.

Here, a distance between the connection bars, which are symmetrical to each other and the closest to an insertion hole 183 of the chamber 180, may be greater than a width of the substrate 10. Even though the plurality of connection bars are symmetrically disposed with respect to the carrying direction of the substrate 10, if the distance between the connection bars that are symmetrically to each other and the closest to the insertion hole 183 of a chamber 180 is less than the width of the substrate 10, the loading of the substrate may interfere, and thus, the substrate 10 may not be loaded. Thus, the distance between the connection bars that are symmetrical to each other and the closest to the insertion hole 183 of the chamber 180 may be equal to the width of the substrate 10. If the distance between the connection bars is equal to the width of the substrate 10, since it may be difficult to load the substrate 10, the distance between the connection bars may slightly increase. Here, to allow the distance between the connection bars that are symmetrical to each other and the closest to the insertion hole 183 of the chamber 180 to more increases, the plurality of connection bars disposed at a position that is further than that that is close to the insertion hole 183 of the chamber 180 has to be biasedly disposed. For this reason, the plurality of connection bars may be biasedly disposed to the portion that is away from the insertion hole 183 of the chamber 180.

As described above, when the plurality of connection bars are disposed symmetrical to each other so that the distance between the connection bars that are symmetrical to each other and the closest to the insertion hole 183 of the chamber 180 is greater than the width of the substrate 10, the substrate may be easily loaded without interfering when the substrate 10 is loaded. Also, since the plurality of connection bars are disposed symmetrical to each other, the plurality of partition plates and the substrate 10 may be stably supported. In addition, when the process gas is supplied in the loading direction of the substrate 10, since the process gas flows to an exhaust unit 170 without interfering, the process gas may smoothly flow, and thus, a layer may be effectively grown on the substrate 10.

Also, a height of the lading spaces that are partitioned by the partition plates may change for each loading space and process conditions. Here, a distance between the partition plates may be simply adjusted by a plurality of coupling grooves defined in the connection bars. The flow of the process gas may change according to the height of each of the loading spaces. Also, the height of each of the loading space may be adjusted according to supply conditions of the process gas in each of the loading spaces. For example, when the injection nozzles 131 have diameters different from each other, if the injection nozzles 131 gradually increase in diameter, since an injection angle of the process gas increases, the loading space may be adjusted in height according to the diameter of the injection nozzle 131 to prevent the process gas from having an influence on the adjacent loading space. Here, the height of each of the loading space may be proportional to the diameter of the injection nozzle 131.

The process gas may vary in ratio (or concentration) of a raw material gas, an etching gas, a carrier gas, and a dopant gas according to the loading space (or the processing position and the like). When the ratio of the raw material gas, the etching gas, the carrier gas, and the dopant gas varies, since the flow of the process gas varies, the height of each of the loading spaces that are partitioned by the partition plates 121 may be adjusted to adjust the flow of the process gas according to the ratio of the raw material gas, the etching gas, the carrier gas, and the dopant gas. Thus, the plurality of loading space may be different in height from each other.

An accommodation space in which the substrate boat 110 is accommodated may be defined in the reaction tube 120 to perform the processing process on the substrate 10 loaded in the substrate boat 110. The reaction tube 120 may have a cylindrical shape. Also, the reaction tube 120 may have an opened lower portion in a state in which an upper portion thereof is closed. In this case, when the substrate boat 110 is accommodated in the accommodation space of the reaction tube 120 or vertically elevated to get out of the accommodation space of the reaction tube 120, the substrate boat 110 may be inserted into or withdrawn from the accommodation space of the reaction tube 120 through an opening of the reaction tube 120. Also, a lower portion of the reaction tube 120 may include a protrusion that protrude outward from the circumference of the reaction tube 120 and is connected to an external tube (not shown) or the chamber 180 so that the reaction tube 120 is connected to and supported by an inner wall of the external tube (not shown) or the chamber 180.

Also, the reaction tube 120 may provide a substrate processing region in which the substrate processing process is performed. When the substrate boat 110 changes in position to the process position, the substrate boat 110 may be disposed in the substrate processing region, and the substrate processing region may be reduced in volume. In this case, a usage amount of process gas may be minimized, and also, the process gas may be concentrated onto the substrate 10 loaded in the substrate boat 110.

The reaction tube 120 may be formed of ceramic, quartz, or a material in which a metal is coated with ceramic. Also, the reaction tube 120 may have through hoes in a circumference of a sidewall thereof to correspond to the injection nozzle 131 and an exhaust unit 170. Here, the injection hole 131 may be inserted into the through hole to pass.

Also, the reaction tube 120 may include an internal tube and an external tube. Each of the internal tube and the external tube may have a cylindrical shape and be disposed above a lower chamber 182 or in an upper chamber 181. The external tube may be disposed between the upper chamber 181 and the internal tube. The internal tube may have an inner space in which the substrate boat 110 is accommodated so that the substrate processing process is performed. The external tube may have an inner space in which the internal tube is accommodated so that the substrate processing process is performed. Also, each of the internal and external tubes may have an opened lower portion. Here, an inner wall of the external tube and an outer wall of the internal tube may be spaced apart from each other to form a space between the external tube and the internal tube. However, the structure and shape of the external tube are not limited thereto and thus may variously vary.

The gas supply unit 130 may supply the process gas into the reaction tube 120 through the injection nozzle 131. Here, the gas supply unit 130 may supply the process gas containing the raw material gas and the etching gas. The injection nozzle 131 may be disposed on one side (or a side surface) of the reaction tube 120. The injection nozzle 131 may be one linear injection nozzle or a plurality of injection nozzles that are linearly disposed. In case of the plurality of injection nozzles 131 that are linearly disposed, the injection nozzles 131 may be provided for each loading space in which each substrate 10 is loaded.

Also, the plurality of injection nozzles 131 that are linearly disposed may be vertically disposed. Also, the plurality of injection nozzles 131 may gradually increase in diameter in a direction that is away from a gas supply source (not shown). For example, when the process gas is supplied upward from a lower side through a single gas supply line, an upper injection nozzle 131a may have a diameter greater than that of a lower injection nozzle 131b.

In detail, in case of the injection nozzle 131b that is close to the gas supply source, the process gas may be supplied from an adjacent position and thus easily introduced. On the other hand, in case of the injection nozzle 131a that is away from the gas supply source, the process gas may be supplied from a distant position, and thus, it may be difficult to supply the process gas when compared to the adjacent injection nozzle 131b. Thus, when the process gas is supplied through the single gas supply line and then distribution by the plurality of injection nozzles 131, amounts of process gas injected from the lower injection nozzle 131b that is close to the gas supply source and the upper injection nozzle 131a that is far away from the gas supply source may be different from each other. Thus, the injection nozzle 131b that is close to the gas supply source may decrease in diameter to reduce an amount of process gas to be injected. Also, the injection nozzle 131a that is far away from the gas supply source may increase in diameter to increase an amount of process gas to be injected. That is, the injection nozzles 131 may be adjusted in diameter so that a uniform amount of process gas is supplied through the injection nozzle 131b that is disposed close to the gas supply source and the inject nozzle 131a that is far away from the gas supply unit. Thus, the uniform amount of process gas may be supplied to each of the substrates 10 to improve process efficiency.

Also, the gas supply unit 130 may heat the process gas. In this case, the limitation in which a region of the injection nozzle 131 has a temperature less than those of other regions due to a low temperature of the process gas may be solved. In detail, it is necessary to heat the reaction tube 120 through a heating unit 140 so as to adjust the process conditions in the substrate processing space.

The substrate processing apparatus 100 in accordance with an exemplary embodiment may be selective epitaxial growth (SEG) equipment. In the SEG equipment, a small amount of etching gas may be mixed with the raw material gas, and then, the mixture may be supplied. Thus, etching reaction together with deposition reaction may be involved on the substrate. The deposition and etching reaction may occur at the same time at relatively different reaction rates on a polycrystalline layer and an epitaxial layer. During the deposition process, although the epitaxial layer is formed on a mono-crystalline surface while the existing polycrystalline layer or amorphous layer is deposited on at least one second layer, the deposited polycrystalline layer may be generally etched at a rate that is greater than that at the epitaxial layer. Thus, as an etchant gas changes in concentration, a net selective process may result in deposition of an epitaxy material and limited or non-limited deposition of a polycrystalline material. For example, in the SEG equipment, an epitlayer formed of a silicon-containing material may be formed on a mono-crystalline silicon surface without allowing the deposited material to remain on a spacer.

In the substrate processing apparatus 100 in accordance with an exemplary embodiment, the epitaxial layer may be formed on the substrate 10. In general, a transfer process, a cleaning process, and an epitaxial process may be performed in the substrate processing equipment. Since a more time is taken to perform the epitaxial process than the cleaning process, manufacturing yield may be improved through the plurality of substrate processing apparatuses 100. The substrate processing apparatus 100 may perform the epitaxial process. When the epitaxial process is performed, the process gas may be supplied into all the processing spaces. The process gas may include at least one of the raw material gas (e.g., a silicon gas), the etching gas, the dopant gas, and the carrier gas. The gases may be mixed at various ratios, and then, the mixture may be supplied to control a thickness of a layer to be grown on the substrate 10. Since the gases have molecular weights different from each other, a flow of the process gas may vary according to the ration of the gases. Thus, in the epitaxial process, the flow of the process gas may be an important factor in determining the thickness and composition of the layer to be grown on the substrate 10.

The epitaxial process may be performed by chemical vapor deposition. The epitaxial process may be performed to form the epitaxial layer on an epitaxy surface. For example, the epitaxy surface on the substrate 10 may be exposed by the process gas including a silicon gas (e.g., $SiCl_4$, $SiHCl_3$, $SiH_2Cl_2$, $SiH_3Cl$, $Si_2H_6$, or $SiH_4$) and a carrier gas (e.g., $N_2$ and/or $H_2$). Also, when the epitaxial layer 76 is required to contain a dopant, the silicon gas may further include a dopant gas (e.g., $AsH_3$, $PH_3$, or $B_2H_6$).

The gas supply unit 130 may supply the process gas containing the raw material gas and the etching gas onto the plurality of substrates 10 through the injection nozzle 131. The process gas may include the raw material gas (e.g., the silicon gas such as $SiCl_4$, $SiHCl_3$, $SiH_2Cl_2$, $SiH_3Cl$, $Si_2H_6$, and $SiH_4$) and the etching gas. Monosilane ($SiH_4$) and dichloro silane (DCS: $SiH_2Cl_2$) may be uses as the raw material gas, and hydrogen chloride (HCl) may be used as the etching gas. The process gas may further include the carrier gas. The carrier gas may dilute a concentration of the raw material gas or the etching gas. Also, at least one of nitrogen ($N_2$) and hydrogen ($H_2$) may be used as the carrier gas. Thus, an amount of carrier gas to be supplied may be controlled to control the concentration of the raw material gas or the etching gas. The raw material gas, the etching gas, and the carrier gas may be easily mixed with each other because the raw material gas, the etching gas, and the carrier gas have molecular weights different from each other. However, the process gas is not limited thereto. For example, the process gas may further include various gases such as the dopant gas. A selective epitaxial growth process involves the deposition reaction and the etching reaction. If it is required that the epitaxial layer includes dopant, the dopant gas (e.g., $AsH_3$, $PH_3$, or $B_2H_6$) may be contained. The etching gas including the hydrogen chloride (HCl) may be used for cleaning as wall as for etching.

The gas supply unit 130 may further include a plurality of auxiliary nozzles (not shown) that are respectively provided for each of the substrate loading spaces. The plurality of auxiliary nozzles (not shown) may supply an auxiliary gas to each of the substrates 10 in the substrate processing process. Here, the plurality of auxiliary nozzles may supply a gas different from the process gas. The plurality of auxiliary nozzles may supply at least one of the dopant gas, the carrier gas, and the etching gas. The dopant gas may be mixed with the raw material gas (e.g., the silicon gas) to deposit the grown layer on the substrate 10, and the carrier gas may dilute the concentration of the raw material gas or the etching gas. As a result, when the dopant gas within each of the loading spaces in which the substrates 10 are processed is controlled in concentration, the grown layer (e.g., the silicon thin film) may be individually controlled in doping concentration. Also, when a supply amount of carrier gas to be supplied into each of the loading spaces is controlled, the raw material gas or the etching gas may be individually controlled in concentration for each loading space. Thus, the dopant gas, the carrier gas, and the etching gas may be selectively used through the plurality of auxiliary nozzles to select the substrate processing process for each load space. That is, when only the etching gas is supplied through the plurality of auxiliary nozzles, a mixed ratio of the etching rate within the loading space may increase to perform the etching process so that the selective epitaxial growth is realized on the substrate 10. Also, when only the dopant gas is supplied, a mixed ratio of the dopant gas within the loading space may increase, and thus, the raw material gas and the dopant gas may be mixed with each other to form the grown layer on the substrate 10. Also, the process gas supplied into the loading spaces at different ratios due to a different in distance with respect to the gas supply source may be controlled to be supplied into the loading spaces at the same component and molecular weight.

In detailed description with respect to the selective epitaxial growth, when only the etching gas is supplied, or only the etching gas and the carrier gas are supplied, the process gas and the gas supplied through the plurality of auxiliary nozzles may be mixed with each other, and thus, the etching gas within the loading space may increase in ratio. Thus, the grown layer may be removed by the etching gas at a portion, on which the grown layer is slowly grown, before the grown layer is grown. On the other hand, a layer may be deposited before the grown layer is removed by the etching gas to form the grown layer at a portion on which the grown layer is quickly grown. As described above, the etching gas may be controlled in concentration through the plurality of auxiliary nozzles to perform the selective epitaxial process.

Here, when the supply of the gas through the plurality of auxiliary nozzles is stopped, the process gas may be supplied by the injection nozzle 131 to form the grown layer (e.g., the silicon thin film) on the substrate 10 within the loading space. Also, the gas may be supplied into each of the auxiliary nozzles through gas supply lines different from each other. Thus, the dopant gas, the carrier gas, and the etching gas may be selectively supplied for each of the loading spaces. Also, the plurality of auxiliary nozzles may be disposed at heights different from each other to separately supply the gas into each of the loading spaces of the substrate boat 110. For example, the auxiliary nozzle contacting the lower loading space may be disposed at a relatively low height, and the auxiliary nozzle contacting the upper loading space may be disposed at a relatively high height. The plurality of auxiliary nozzles may be spirally disposed along the circumference of the reaction tube 120. In this case, the plurality of auxiliary nozzles may be successively disposed from the auxiliary nozzle that is disposed at the highest height to the auxiliary nozzle that is disposed at the lowest height. Thus, when compared to a structure in which a plurality of auxiliary nozzles disposed at heights different from each other are irregularly disposed, spatial efficiency may be improved.

In the batch type substrate processing apparatus, the plurality of substrates may be vertically loaded to perform the process. Here, the plurality of substrate processing processes may be performed at an increased temperature. In this case, it is necessary to uniformly heat the substrates that are vertically stacked so that the uniform processing process is performed on all the substrates. In addition, since the process gas is injected in a lateral direction of each of the substrates, a method for improving uniformity on an entire surface of the substrate is required. Since the heating unit uniformly heats the entire region at the outside of the reaction tube in the typical substrate processing apparatus, each of upper and lower portions may have a temperature less than that of an intermediate portion due to a difference in temperature between the upper and lower portions and the surrounding portion. Thus, it may be difficult to perform the uniform processing process. Also, since the circumference of the reaction tube is uniformly heated, a gas partial pressure on each of the substrates may be relatively high to cause a difference in substrate processing between the injection nozzle region that is affected by the temperature of the process gas and other regions.

The heating unit 140 may be provided in the chamber 180 along the circumference of the reaction tube 120 outside the reaction tube 120 to surround the circumference of the side surface and the upper portion of the reaction tube 120. The heating unit 140 may provide thermal energy to the reaction tube 120 to heat the inner space of the reaction tube 120. The heating unit 140 may include a resistance heater and adjust a temperature of the inner space of the reaction tube 120 to a temperature at which the epitaxial process is enabled.

For example, if the temperature is too high, the deposition material may not be well absorbed to the substrate 10. On the other hand, if the temperature is too low, the reaction of the process gas may not well occur, and thus, the grown layer may not be grown on the substrate 10. Thus, the temperature of the inner space of the reaction tube 120 may be adjusted to a temperature at which the epitaxial process is enabled. Also, the growth rate may increase according to a temperature. As the temperature increases, a deposition rate of the deposition material may increase to increase the growth rate. Thus, the temperature at which the substrate 10 is processed may be adjusted to adjust the growth rate. Here, when temperature of portions (or areas) of the substrate 10 are different from each other, the growth rate of the grown layer may be different at each of the portions of the substrate 10, and thus, the layer to be grown on the substrate 10 may be non-uniformly grown. Also, when temperatures of the portions of the substrate 10 are different from each other, the non-uniformity in substrate processing may occur in a processing process for the other substrate 10.

Also, the heating unit 140 may include the plurality of vertical heating parts that divide the circumference of the reaction tube 120 to independently heat the each of the divided portions of the reaction tube 120. When the heating unit 140 includes the plurality of vertical heating parts 141 and 142, the reaction tube 120 may be divided along the circumference thereof by the plurality of vertical heating parts 141 and 142, and thus, the divided portions of the reaction tube 120 may be independently heated to adjust the process temperature (or the process rate) for each portion of the substrate 10, thereby improving the process uniformity on the entire surface of the substrate 10. Here, the plurality of vertical heating parts 141 and 142 may perform uniform heating along a vertical level.

Figure 2:
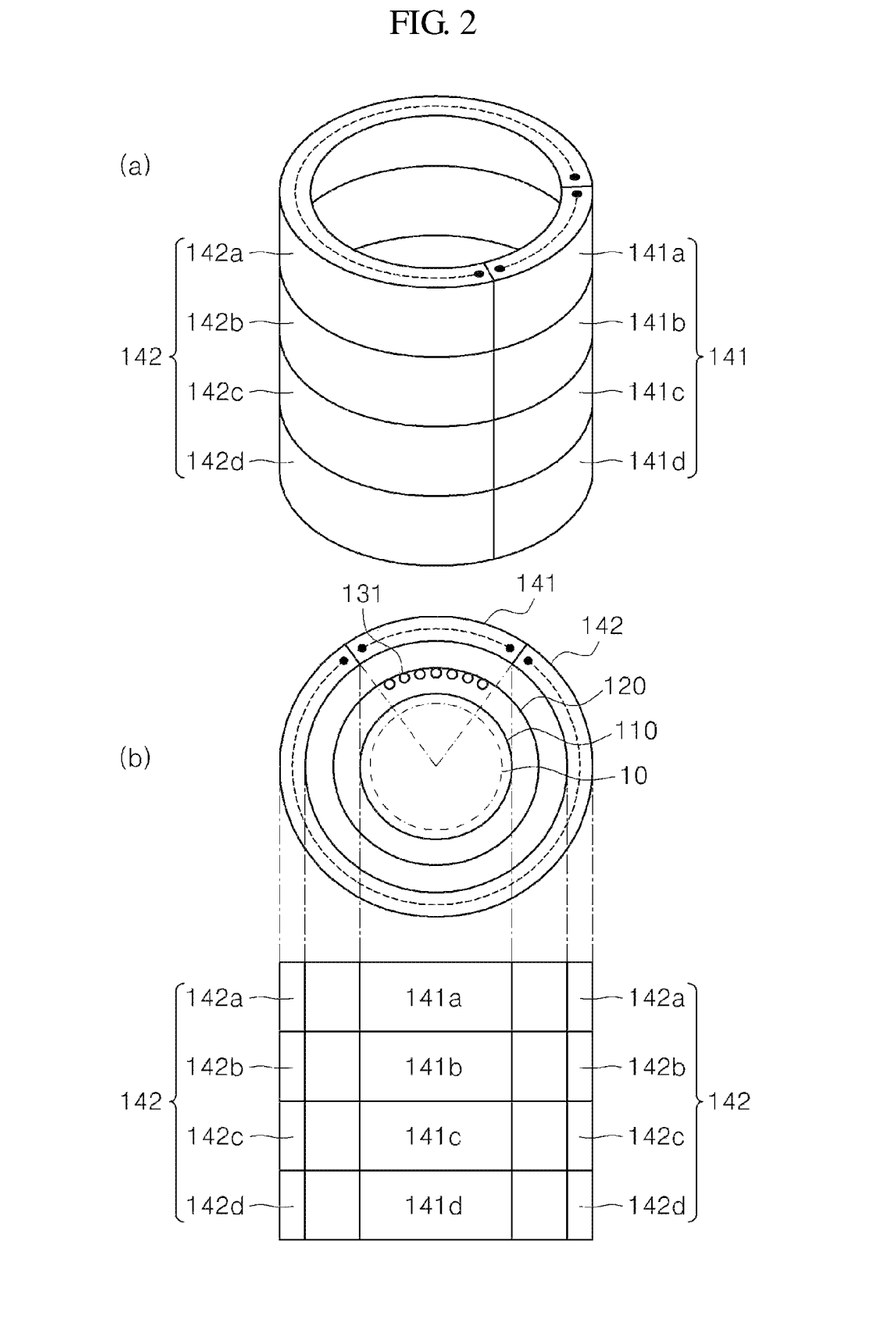
FIG. 2 is a view of a heating unit constituted by a plurality of vertical heating parts in accordance with an exemplary embodiment.

FIG. 2 is a view of the heating unit constituted by the plurality of vertical heating parts in accordance with an exemplary embodiment, (a) of FIG. 2 is a perspective view of the heating unit constituted by the plurality of vertical heating parts, and (b) of FIG. 2 is a plan view and a side cross-sectional view of the heating unit constituted by the plurality of vertical heating parts.

Referring to FIGS. 1 and 2, the plurality of vertical heating parts 141 and 142 may include a first vertical heating part 141 disposed at a position corresponding to the injection nozzle 131 and a second vertical heating part 142 extending along the circumference of the reaction tube 120 from the first vertical heating part 141 and disposed on at least a portion of the circumference of the reaction tube 120.

The first vertical heating part 141 may constitute a portion of the circumference of the reaction tube 120 and be disposed in a region of the injection nozzle 131 (or a position corresponding to the injection nozzle). Since the region of the injection nozzle 131 is relatively higher than those of other regions, if the region of the injection nozzle 131 is heated under the same condition as other regions, the processing of the substrate 10 may be further performed at the portion adjacent to the injection nozzle 131 when compared to other portions. When the heating temperature of the region of the injection nozzle 131 is lower than those of other regions, the entire surface of the substrate 10 may be uniformly processed. Also, the region of the injection nozzle 131 may decrease or increase in temperature than those of other regions by the temperature of the supplied process gas. Here, since the heating temperature increases or decreases to match the temperature of the region of the injection nozzle 131, the inner temperature of the reaction tube 120 may be uniformly controlled in the entire region, and the uniformity on the entire surface of the substrate 10 may be improved.

The second vertical heating part 142 may extend along the circumference of the reaction tube 120 from the vertical heating part 141, constitute a portion of the circumference of the reaction tube 120, and be disposed at a position different from that of the first vertical heating part 141. Here, the second vertical heating part 142 may extend from one side of the first vertical heating part 141 and connected to the other side of the first vertical heating part 141 to form a closed curve (e.g., a cylindrical shape). Alternatively, the second vertical heating part 142 may form the closed curve together with the other vertical heating part (e.g., a third vertical heating part) as well as the first vertical heating part 141. The second vertical heating part 142 may heat other regions in addition to the first vertical heating part 141. Thus, other regions in addition to the region of the injection nozzle 131 may have a uniform temperature.

The first vertical heating part 141 may have a horizontal cross-sectional area less than that of the second vertical heating part 142. Since the first vertical heating part 141 is provided in only the region of the injection nozzle 131, the horizontal cross-sectional area of the first vertical heating part 141 may be less than that of the second vertical heating part 142. The injection nozzle 131 may occupy a small area because the injection nozzle 131 has to form a laminar flow together with the exhaust unit 170, and the second vertical heating part 142 may be disposed in other regions except for the region of the injection nozzle 131. Thus, the second vertical heating part 142 may serve as a main heater to control the overall temperature of the inside of the reaction tube 120, and the first vertical heating part 141 may serve as an auxiliary heater to locally control a temperature of the region of the injection nozzle 131. Here, the laminar flow may be an averaged uniform flow that is maintained in a horizontal direction. In the batch type substrate processing apparatus, since the process gas is supplied to a side direction of the substrate 10, the laminar flow may be used for uniformly processing the substrate on the entire surface of the substrate 10.

Also, the first vertical heating part 141 may have a heating temperature corresponding to a range from 90% to 110% of a heating temperature of the second vertical heating part 142. The heating unit 140 may use the second vertical heating part 142 as the main heater and also be used as an auxiliary heater for finely and locally adjusting (or tuning) the temperature of the first vertical heating part 141. Thus, the temperature of the inner space of the reaction tube 120 may be adjusted to a temperature, at which the epitaxial process is enabled, through the second vertical heating part 142, and thus, the inner temperature of the reaction tube 120 may be uniformly and finely adjusted on the entire region through the first vertical heating part 141. Here, since the second vertical heating part 142 serves as the main heater for adjusting the overall temperature of the inner space of the reaction tube 120, the temperature of the first vertical heating part 141 may be adjusted based on the temperature (100%) of the second vertical heating part 142.

The temperature of the first vertical heating part 141 may be adjusted to a heating temperature corresponding to a range form 90% to 110% of the heating temperature of the second vertical heating part 142. When a difference in temperature between the first vertical heating part 141 and the second vertical heating part 142 exceeds 10% (or ±10%), the reaction tube 120 may not be uniformly heated due to the difference in temperature between the first vertical heating part 141 and the second vertical heating part 142 to cause a difference in temperature of the reaction tube 120, thereby damaging or deforming the reaction tube 120. For example, when the reaction tube 120 is formed of quartz, the reaction tube 120 may be broken.

The plurality of vertical heating parts 141 and 142 may be formed by stacking a plurality of horizontal heating elements 141a and 142a that are independently controlled. In the batch type substrate processing apparatus, when the vertical heating part 141 or 142 heats the vertical level of the reaction tube 120 at the same temperature, each of the upper and lower portions may have a temperature less than that of the intermediate portion due to a difference in temperature between the upper and lower portions and the surrounding portion. Thus, it may be difficult to uniformly perform the processing process on the substrates 10. Also, it is necessary to control a temperature for each position according the heights so as to adjust the process condition for each processing space of the substrates 10. Thus, in an exemplary embodiment, the plurality of horizontal heating elements 141a and 142a that are independently controlled may be stacked to form the vertical heating part 141 or 142 and thus heat the upper and lower ends, at which the difference in temperature with respect to the surrounding occurs, at a temperature (e.g., a higher temperature) different from those of other portions, thereby uniformly heating the reaction tube 120 according to the vertical level. Thus, the inner temperature of the reaction tube 120 may be uniform in the entire region, and the process condition for each processing space of the substrates 10 may be adjusted for each position according to the height thereof.

The control unit 150 may control the heating unit 140. Here, the control unit 150 may be connected to the heating unit 140 to independently control the plurality of vertical heating parts 141 and 142. Thus, since the plurality of vertical heating parts 141 and 142 are independently controlled by the control unit 150, the plurality of vertical heating parts 141 and 142 may divide the circumference of the reaction tube 120 to independently heat the divided portions of the reaction tube 120.

Figure 3:
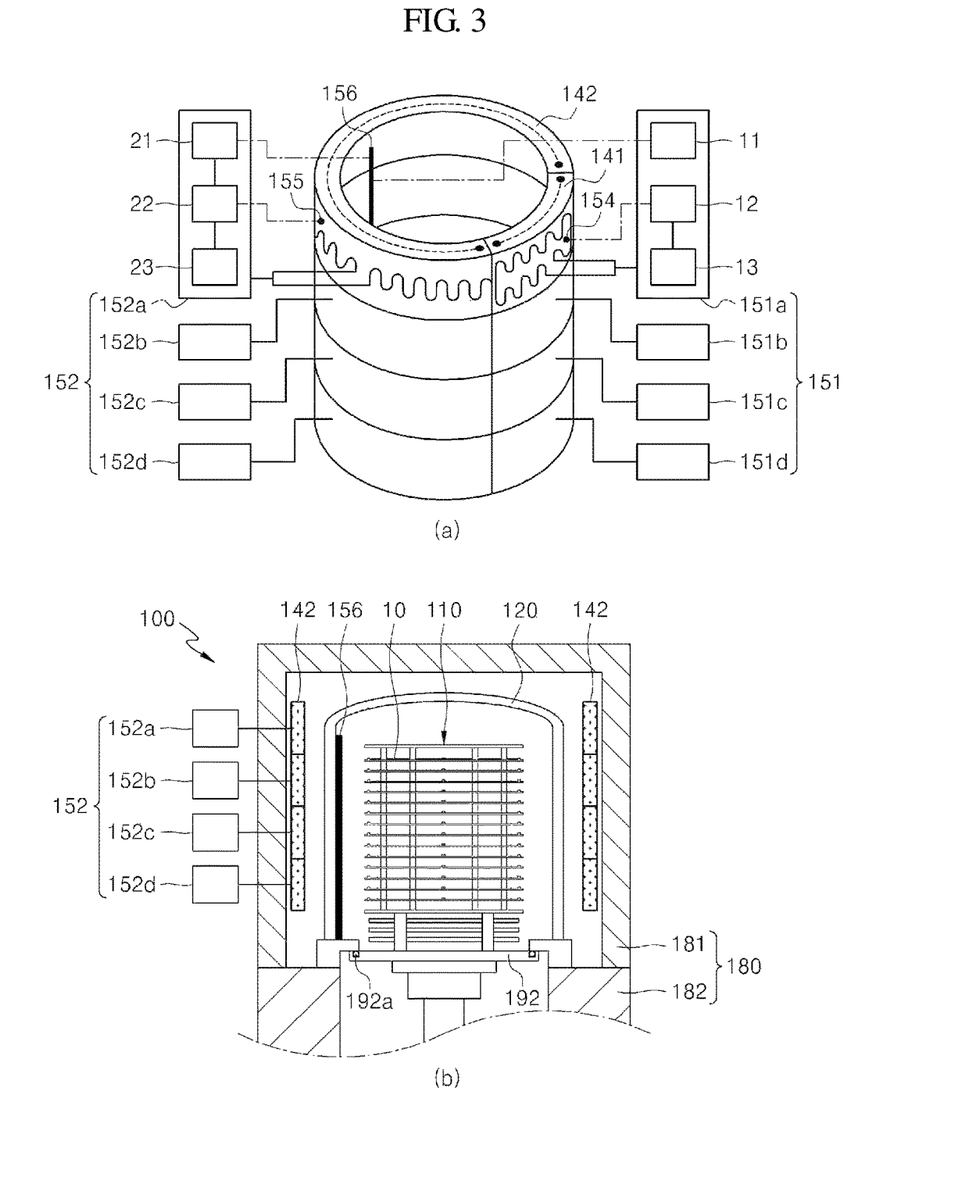
FIG. 3 is a conceptual view for explaining connection between the plurality of vertical heating parts and the control unit in accordance with an exemplary embodiment.

FIG. 3 is a conceptual view for explaining connection between the plurality of vertical heating parts and the control unit in accordance with an exemplary embodiment, (a) of FIG. 3 is a view illustrating a connection relationship between the plurality of vertical heating parts and the control unit, and (b) of FIG. 3 is a view illustrating arranged positions of the plurality of vertical heating parts and the control unit.

Referring to FIGS. 1 and 3, the control unit 150 may include a first control part 151 connected to the first vertical heating part 141 and a second control part 152 connected to the second vertical heating part 142 to independently control the first and second vertical heating parts 141 and 142.

The first control part 151 may be connected to the first vertical heating part 141 to control the heating of the first vertical heating part 141. When the first vertical heating part 141 includes a plurality of horizontal heating elements 141a, 141b, 141c, and 141d, the first vertical heating part 141 may be connected to each of the plurality of horizontal heating elements 141a, 141b, 141c, and 141d to control the first vertical heating part 141.

Also, the first control part 151 may include a first temperature measuring member 154 measuring a temperature of the first vertical heating part 141. The first temperature measuring member 154 may be connected to the first vertical heating part 141 to measure a temperature of the first vertical heating part 141. The first temperature measuring member 154 may be a spike thermocouple. In this case, the first temperature measuring member 154 may contact the first vertical heating part 141 or be disposed between the first vertical heating part 141 and the reaction tube 120 to measure an external temperature (or an atmosphere temperature) of the reaction tube 120 around the first vertical heating part 141.

For example, a temperature between the first vertical heating part 141 and the reaction tube 120 may be measured through the first temperature measuring member 154 to determine whether heat of the first vertical heating part 141 is well transferred to the inside of the reaction tube 120. If the heat of the first vertical heating part 141 is not well transferred into the reaction tube 120 (i.e., into the region of the injection nozzle) (or if a temperature between the first vertical heating part and the reaction tube is less than a reference temperature), a heating temperature of the first vertical heating part 141 may increase. Also, if the heat of the first vertical heating part 141 is well transferred into the reaction tube 120 (or if a temperature between the first vertical heating part and the reaction tube is greater than the reference temperature), a heating temperature of the first vertical heating part 141 may decrease.

Here, the spike thermocouple may pass through a hole defined in the vertical heating part 141 or 142 and be mounted to be spaced a predetermined distance from the reaction tube 120 (e.g., the external tube). For example, a plurality of holes may be defined at a predetermined distance with a predetermined height to confirm (or detect) an external temperature of the reaction tube 120 according to a height, and a plurality of spike thermocouples may be respectively mounted in the holes. The spike thermocouple may include a thermocouple wire. The thermocouple wire may pass through the hole and be inserted adjacent to the reaction tube 120. Also, since the thermocouple wire is manufactured by connecting both ends of two metal wires different from each other to each other, when a temperature difference occurs at contact portions of both ends, thermal electromotive force may be generated in a closed circuit to allow current to flow through the circuit. Since the intensity and polarity of the thermal electromotive force is determined by temperatures of both ends and combination of the two metal wires, the intensity and polarity may not be affected by a thickness and length of each of the metal wire. Thus, since the thermal electromotive force according to a temperature of a specific thermocouple is previously known, a temperature may be measured through the spike thermocouple.

A kind of thermal contacts for measuring a temperature may include a front end exposing-type contact, a ground-type contact, and a non-ground-type contact. The front end exposing-type contact may have a shape in which the thermocouple wire is exposed to install a thermal contact and thus have a rapid response rate and be sensitive to a minute temperature change. The ground-type contact may have a shape in which the thermocouple wire is grounded to install a thermal contact and thus has a rapid response rate and be adequate for measuring a temperature under a high temperature and a high pressure. The non-ground-type contact may have a shape in which the thermocouple wire is insulated to install a thermal contact and thus have a slight change in thermal electromotive force, be used for a relatively lone time, and used without affecting noises and voltages.

The second control part 152 may be connected to the second vertical heating part 142 to control the heating of the second vertical heating part 142. When the second vertical heating part 142 includes a plurality of horizontal heating elements 142a, 142b, 142c, and 142d, the second vertical heating part 142 may be connected to each of the plurality of horizontal heating elements 142a, 142b, 142c, and 142d to control the second vertical heating part 142.

Also, the second control part 152 may include a second temperature measuring member 155 measuring a temperature of the second vertical heating part 142 and a third temperature measuring member 156 measuring the inner temperature of the reaction tube 120. The second temperature measuring member 155 may be connected to the second vertical heating part 142 to measure a temperature of the second vertical heating part 142. The second temperature measuring member 155 may be a spike thermocouple. In this case, the second temperature measuring member 155 may contact the second vertical heating part 142 or be disposed between the second vertical heating part 142 and the reaction tube 120 to measure an external temperature (or an atmosphere temperature) of the reaction tube 120 around the second vertical heating part 142.

The third temperature measuring member 156 may measure the inner temperature of the reaction tube 120. Here, the third temperature measuring member 156 may be disposed adjacent to the reaction tube 120 to measure the inner temperature, and the value measured by the third temperature measuring member 156 may be a surrounding temperature that is close to the substrate 10 and at which a temperature of the substrate 10 is capable of being confirmed. Also, the third temperature measuring member 156 may be a profile thermocouple. In this case, the third temperature measuring member 156 may be disposed in a region except for the region of the injection nozzle 131 to measure the inner temperature of the reaction tube 120 (e.g., the external tube) that is in a vacuum state, thereby confirming whether a process being performed in the reaction tube 120 is performed under a normal temperature condition.

Here, the profile thermocouple may be disposed between the internal tube of the reaction tube 120 and the external tube of the reaction tube 120. Also, the profile thermocouple may be disposed in the reaction tube 120 to measure an actual temperature at which the process is performed in the reaction tube 120.

Also, the first control part 151 may control the first vertical heating part 141 by using the value measured by the first temperature measuring member 154, and the second control part 152 may control the second vertical heating part 142 by using a value calculated by a measured value of the second temperature measuring member 155 and a measured value of the third temperature measuring member 156.

The first control part 151 may include a first input part 12 receiving the measured value of the first temperature measuring member 154 and a temperature control part 13 controlling a heating temperature of the first vertical heating part 141 according to the measured value of the first temperature measuring member 154. The first input part 12 may be connected to the first temperature measuring member 154 to receive the measured value of the first temperature measuring member 154. Also, the first input part 12 may transmit the measured value received from the first temperature measuring member 154 to the temperature control part 13.

The temperature control part 13 may control the heating temperature of the first vertical heating part 141 according to the measured value of the first temperature measuring member 154, which is received from the first input part 12. Here, when the measured value of the first temperature measuring member 154 is less than the normal temperature condition for performing the process, the first vertical heating part 141 may increase in heating temperature. Also, when the measured value of the first temperature measuring member 154 is greater than the normal temperature condition for performing the process, the first vertical heating part 141 may decrease in heating temperature.

The first control part 151 may further include a temperature output part 11 connected to a temperature measuring member for measuring the inner temperature of the reaction tube 120 such as the third temperature measuring member 156 to receive and output the measured value. Here, the output value of the temperature output part 11 may be used as a simple reference value, but may not be used as data for controlling the first vertical heating part 141. Also, the temperature output part 11 may be connected to the third temperature measuring member 156. Alternatively, the temperature output part 11 may be connected to a separate temperature measuring member (not shown) that is the same kind as the third temperature measuring member 156.

The second control part 152 may include a second input part 22 receiving the measured value of the second temperature measuring member 155, a third input part 21 receiving the measured value of the third temperature measuring member 156, and a calculation control part 23 that controls the heating temperature of the second vertical heating part 142 by performing a calculation on the measured value of the second temperature measuring member 155, which is received from the second input part 22, and the measured value of the third temperature measuring member 156, which is received from the third input part 21. The second input part 22 may be connected to the second temperature measuring member 155 to receive the measured value of the second temperature measuring member 155. Also, the second input part 22 may transmit the measured value received from the second temperature measuring member 155 to the calculation control part 23.

The third input part 21 may be connected to the third temperature measuring member 156 to receive the measured value of the third temperature measuring member 156. Also, the third input part 21 may transmit the measured value received from the third temperature measuring member 156 to the calculation control part 23.

The calculation control part 23 may perform the calculation on the measured values of the second temperature measuring members 155 and the measured values of the third temperature measuring members 156 by receiving respectively the measured value of the second temperature measuring member 155 and the measured values of the third temperature measuring members 156 from the second input part 22 and the third input part 21, and control the heating temperature of the second vertical heating part 142 on the basis of the calculations.

Thus, the second control part 152 may cascade-control the second vertical heating part 142 by connecting the second input part 22, the third input part 21, and the calculation control part 23 to each other. Thus, the second control part 152 may be calculated to merge measured value data of the second temperature measuring member 155 with measured value data of the third temperature measuring member 156 by performing the calculation on the measured value of the second temperature measuring member 155 and the measured value of the third temperature measuring member 156. For this reason, the second control part 152 may more effectively control the second vertical heating part 142 to maintain the second vertical heating part 142 in performance as the main heater and control the overall temperature within the reaction tube 120. Here, a value of the calculation may be a median or mean value between the measured value of the second temperature measuring member 155 and the measured value of the third temperature measuring member 156 and be a value obtained by dividing the sum of the measured value of the second temperature measuring member 155 and the measured value of the third temperature measuring member 156 by the number (e.g., 2) of measured values.

The first control part 151 may control the heating temperature of the first vertical heating part 141 by using only the temperature (the measured value of the first temperature measuring member) of the first vertical heating part 141. When the temperature (or the value of the third temperature measuring member or a measured value of a separate temperature measuring member) of the second vertical heating part 142 is used also, the inner temperature of the reaction tube 120, which is stabilized by convection may be reflected when the first vertical heating part 141 heating a local region in which a difference in temperature with respect to other regions occurs. Thus, the heating effect of the second vertical heating part 142 may be reflected to the control of the first vertical heating part 141, and thus, it may be difficult to control the first vertical heating part 141 that changes a temperature of the local region. That is, although the first and second vertical heating parts 141 and 142 independently heat the reaction tube 120, the first and second vertical heating parts 141 and 142 may be similarly controlled to heat temperature that are almost similar to each other, regardless of the temperature of the local region.

As described above, a method of controlling the first control part 151 controlling the first vertical heating part 141 and a method of controlling the second control part 152 controlling the second vertical heating part 142 may be different from each other. Thus, a temperature difference in the local region may be solved through the effective control of the first and second vertical heating parts 141 and 142 to prevent the non-uniformity in the substrate processing due to the temperature difference in the local region from occurring and improve the process uniformity on the entire surface of the substrate 10.

The substrate processing apparatus 100 in accordance with an exemplary embodiment may further include a rotation driving unit 160 rotating the substrate boat 110. The rotation driving unit 160 may be disposed under the substrate boat 110 to rotate the substrate boat 110. Here, the rotation driving unit 160 may rotate the substrate boat 110 with respect to a central axis in a vertical direction of the substrate boat 110. Thus, the substrate loaded in the substrate boat 110 may be rotated also. When the substrate processing process is performed, the process gas supplied to one side of the reaction tube 120 may pass through the substrate 10 loaded in the substrate boat 110 and then be discharged to the other side of the reaction tube 120. Here, when the substrate boat 110 is rotated by an operation of the rotation driving unit 160, a gas passing through the substrate boat 110 may be mixed. As a result, a portion of the substrate 10 that is adjacent to the injection nozzle 131 may be changed due to the rotation of the substrate 10 by the rotation of the substrate boat 110. Thus, the process gas may be uniformly distributed on the entire area of the substrate 10.

Also, the inner temperature of the reaction tube 120 may be stabilized in the entire region due to the convection. Thus, the processing process may be performed on the entire surface of the substrate 10 at the uniform temperature.

Therefore, the process gas may be uniformly distributed on the entre area of the substrate 10, and also, the processing process may be performed on the entre surface of the substrate 10 at the uniform temperature to improve the process uniformity and the quality of the grown layer deposited on the substrate 10.

The substrate processing apparatus 100 in accordance with an exemplary embodiment may further include an exhaust unit 170 exhausting residual gases within the reaction tube 120 by being disposed on the other side of the reaction tube 120, which is symmetrical to the injection nozzle 131. The exhaust unit 170 may exhaust the residual gases within the reaction tube 120 through a suction hole 171 defined in the reaction tube 120. Here, process residues within the reaction tube 120 may be exhausted to form vacuum in the reaction tube 120. The exhaust unit 170 may be disposed in the reaction tube 120 and symmetrical to the injection nozzle 131 so that the suction hole 171 corresponds to each of the plurality of injection nozzles 131. Here, the suction hole 171 may be disposed symmetrical to the injection nozzle 131 and have the same number and shape as the injection nozzle 131. The exhaust unit 170 may exhaust the process residues within the reaction tube 120. Here, the process residues may include non-reaction gases and reaction byproducts. When the injection nozzle 131 is provided in plurality, the suction hole 171 may be provided in plurality. When the plurality of suction holes 171 are defined symmetrical to the plurality of injection nozzles 131, the process residuals including the non-reaction gas and the reaction byproducts may be effectively exhausted to effectively control the flow of the process gas. That is, the laminar flow may be generated by the injection nozzles 131 of the gas supply unit 130 and the suction holes 171 of the exhaust unit 170. Also, the process may be may be uniformly supplied to the entire surface of the substrate 10 by the laminar flow that forms the uniform flow averaged to be maintained in the horizontal direction to perform the uniform substrate processing on the entire surface of the substrate 10.

Also, an exhaust rate (or exhaust intensity) may be adjusted to control a growth rate of the layer to be grown on the substrate 10. The plurality of suction holes 171 may be defined at heights different from those of the plurality of injection nozzles 131, and each of the suction holes 171 may have a slot-type cross-section to realize effective suction.

The reaction tube 129 may be disposed on the circumference of the reaction tube 120 to stably support the gas supply line and an exhaust line. Thus, a support member (not shown) having a ring shape to support the gas supply line and the exhaust line may be provided on the reaction tube 129. However, the exemplary embodiment is not limited to the structure and shape of the reaction tube 120. For example, the reaction tube 120 may have various structures and shapes.

Figure 4:
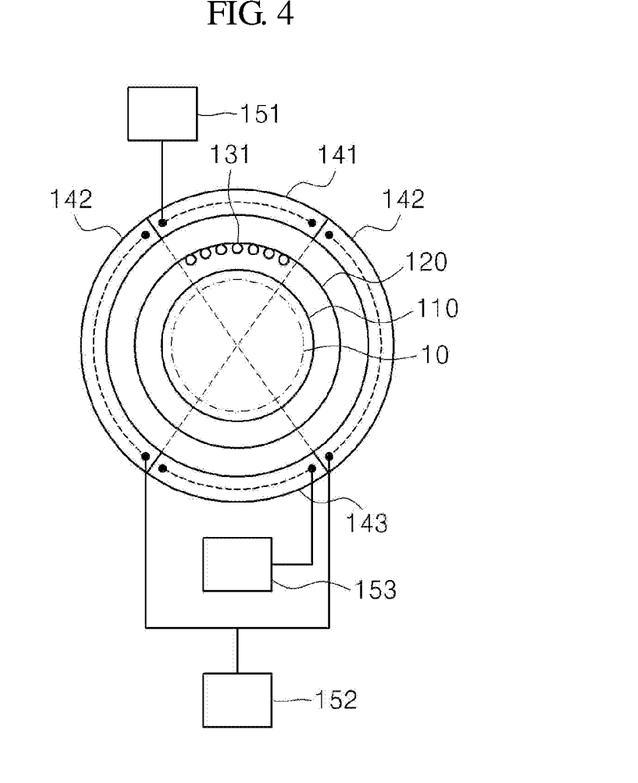
FIG. 4 is a plan view of a plurality of vertical heating parts in accordance with a modified embodiment.

FIG. 4 is a plan view of the plurality of vertical heating parts in accordance with a modified embodiment.

Referring to FIG. 4, the plurality of vertical heating parts 141, 142, and 143 may further include the third vertical heating part 143 disposed symmetrical to the first vertical heating part 141 at a position corresponding to the exhaust unit 170. The third vertical heating part 143 may be disposed in a region of the exhaust unit 170 around the reaction tube 120. Here, the third vertical heating part 143 may be symmetrical to the first vertical heating part 141 and connected to the third control part 153 and thus controlled by the third control part 153. A gas partial pressure may be generated between the region of the exhaust unit 170 and the other region, like the region of the injection nozzle 131. When the exhaust unit 170 has low suction force, the gas partial pressure in the region of the exhaust unit 170 may be relatively lower than those of other regions. Thus, the heating temperature of the third vertical heating part 143 may increase. Also, when the exhaust unit 170 has high suction force, the gas partial pressure in the region of the exhaust unit 170 may be relatively higher than those of other regions. Thus, the heating temperature of the third vertical heating part 143 may decrease.

Also, the third vertical heating part 143 is disposed symmetrical to the first vertical heating part 141 because the exhaust unit 170 is symmetrical to the injection nozzle 131. Here, since the injection nozzles 131 and the suction holes 171 of the exhaust unit 170 have the same shape and number, the first and third vertical heating parts 141 and 143 may have the same shape.

A remaining portion of the circumference of the reaction tube 120 except for the first and third vertical heating parts 141 and 143 may be the second vertical heating part 142. Here, the second vertical heating part 142 may be divided into two or more portions that are symmetrical to each other.

The divided portions may be together (or equally) controlled by the second control part 152.

As described above, the substrate processing apparatus 100 in accordance with an exemplary embodiment may control the region of the exhaust unit 170 at a local temperature to more improve the process uniformity on the entire surface of the substrate 10.

The substrate processing apparatus 100 in accordance with an exemplary embodiment may further include the chamber 180 in which the reaction tube 120 is accommodated. The chamber 180 may have a rectangular box shape or cylindrical shape and have an inner space. Also, the chamber 180 may include the upper chamber 181 and the lower chamber 182. Here, the upper chamber 181 and the lower chamber 182 may communicate with each other. An insertion hole 183 communicating with a transfer chamber 200 may be defined in one side of the lower chamber 182. Thus, the substrate 10 may be loaded from the transfer chamber 200 to the chamber 180. An inflow hole 210 may be defined in one side of the transfer chamber, which corresponds to the insertion hole 183 of the chamber 180. A gate valve 220 may be disposed between the inflow hole 210 and the insertion hole 183. Thus, the inner space of the transfer chamber 200 and the inner space of the chamber 180 may be isolated from each other by the gate valve 220. Also, the inflow hole 210 and the insertion hole 183 may be opened or closed by the gate valve 220. Here, the insertion hole 183 may be defined in the lower chamber 182.

The substrate processing apparatus 100 in accordance with an exemplary embodiment may further include an elevation driving unit 191 elevating the substrate boat 110. The elevation driving unit 191 may be disposed under the lower chamber 182. The elevation driving unit 191 may be connected to a lower portion of the substrate boat 110 by using a shaft extending in a vertical to vertically elevate the substrate boat 110. The shaft may support the substrate boat 110. For example, the substrate boat 110 may move downward by the operation of the elevation driving unit 191 and then be disposed in (or at the loading position) of the lower chamber 182. The substrate 10 loaded from the transfer chamber 200 to the lower chamber may be loaded into the substrate boat 110 that is disposed in the lower chamber 182. Then, when the plurality of substrates are completely loaded into the substrate boat 110, the substrate boat 110 may move upward by the elevation driving unit 191 to move to the upper chamber 181 (the process position). Thus, the epitaxial process may be performed on the substrate 10 in the accommodation space of the reaction tube 120.

The substrate processing apparatus 100 in accordance with an exemplary embodiment may further include a cover plate 192 that is disposed under the substrate boat 110 to block a space between the upper chamber 181 and the lower chamber 182 by the ascending of the substrate boat 110, thereby separating the upper chamber 181 from the lower chamber 182. The cover plate 192 may have a circular plate shape and a diameter greater than that of the substrate boat 110. The cover plate 192 may be disposed under the substrate boat 110 to seal the upper chamber 181 by the ascending of the substrate boat 110. That is, when the substrate processing process is performed, the opened lower portion of the reaction tube 120 or the external tube (not shown) may be closed. Also, a sealing member 192a having an O-ring shape may be disposed between the cover plate 192 and the external tube (not shown) or between the cover plate 192 and the reaction tube 120. Thus, when the substrate processing process is performed, the inside of the reaction tube 120 may be isolated from the lower chamber 182 to prevent the process gas within the upper chamber 181 from being introduced into the lower chamber 182 or foreign substances within the lower chamber 182 from being introduced into the upper chamber 181. However, an exemplary embodiment is not limited to the structure and shape of the cover plate 192. For example, the cover plate 192 may have various structures and shapes.

Although the batch type substrate processing apparatus is mainly described above, the single wafer-type substrate processing apparatus may also be equally applied to the substrate processing apparatus in which the process gas is supplied in a lateral direction of the substrate 10.

As described above, in accordance with the exemplary embodiment, the heating part may be constituted by the plurality of vertical heating parts, and the circumference of the reaction tube may be divided by the plurality of vertical heating parts to independently heat the divided portions, thereby improving the process uniformity on the entire surface of the substrate. Also, since the injection nozzle region in which the gas partial pressure is relatively high and which is affected by the process gas temperature is independently controlled with respect to other regions, the limitation in which the portion of the substrate approaching the injection nozzle is more treated than other portions of the substrate may be solved to improve the process uniformity on the entire surface of the substrate. In addition, since the substrate is rotated through rotation driving unit, the process gas may be uniformly distributed on the entire surface of the substrate, and the process uniformity on the entire surface of the substrate may be more improved. Also, the first vertical heating part provided in the injection nozzle region may measure and control only a temperature of the first vertical heating part, and the second vertical heating part provided in other regions may mutually calculate the temperatures of the second vertical heating part and the inner temperature of the reaction tube to control the calculated temperature, thereby effectively control the process rate and temperature for each area of the substrate. Thus, the process uniformity on the entire surface of the substrate may be more improved.

In the substrate processing apparatus in accordance with the exemplary embodiment, the heating unit may be constituted by the plurality of vertical heating parts, and the circumference of the reaction tube may be divided by the plurality of vertical heating parts to independently heat the divided portions, thereby improving the process uniformity on the entire surface of the substrate. Also, since the injection nozzle region in which the gas partial pressure is relatively high and which is affected by the process gas temperature is independently controlled with respect to other regions, the limitation in which the portion of the substrate approaching the injection nozzle is more processed than other portions of the substrate may be solved to improve the process uniformity on the entire surface of the substrate.

In addition, since the substrate is rotated through rotation driving unit, the process gas may be uniformly distributed on the entire surface of the substrate, and the uniformity in temperature on the entire surface of the substrate may be improved to more improve the process uniformity on the entire surface of the substrate.

Also, the first vertical heating part provided in the injection nozzle region may measure and control only a temperature of the first vertical heating part, and the second vertical heating part provided in other regions may mutually calculate the temperatures of the second vertical heating part and the inner temperature of the reaction tube to control the calculated temperature, thereby effectively control the process rate and temperature for each portion of the substrate.

Thus, the process uniformity on the entire surface of the substrate may be more improved.

Although embodiments have been described with reference to a number of illustrative embodiments thereof, the embodiments are not limited to the foregoing embodiments, and thus, it should be understood that numerous other modifications and embodiments can be devised by those skilled in the art that will fall within the spirit and scope of the principles of this disclosure. Hence, the real protective scope of the present invention shall be determined by the technical scope of the accompanying claims.

What is claimed is:

1. A substrate processing apparatus comprising:
a substrate boat in which a substrate is loaded;
a reaction tube in which a processing process for the substrate loaded in the substrate boat is performed;
a gas supply unit configured to supply a process gas into the reaction tube through a plurality of injection nozzles vertically disposed on one side of the reaction tube;
a heating unit comprising a plurality of vertical heating parts disposed along a circumference of the reaction tube to surround the circumference of the reaction tube; and
a control unit configured to control the heating unit;
wherein the plurality of vertical heating parts comprise:
a first vertical heating part disposed at a position corresponding to the injection nozzle; and
a second vertical heating part extending along the circumference of the reaction tube from one side to the other side of the first vertical heating part,
wherein the first vertical heating part and the second vertical heating part surround the circumference of the reaction tube
and respectively heat a region corresponding to the injection nozzle and other regions having the same height in an inside space of the reaction tube, and
wherein the control unit is configured to control the first vertical heating part and the second vertical heating part so that the region corresponding to the injection nozzle, which has a gas partial pressure greater than the other regions having the same height, has a temperature less than the other regions having the same height.

2. The substrate processing apparatus of claim 1, wherein the first vertical heating part has a horizontal cross-sectional area less than that of the second vertical heating part.

3. The substrate processing apparatus of claim 1, wherein the first vertical heating part has a heating temperature corresponding to a range from 90% to 110% of a heating temperature of the second vertical heating part.

4. The substrate processing apparatus of claim 1, wherein the control unit comprises:
a first control part connected to the first vertical heating part; and
a second control part connected to the second vertical heating part,
wherein the first vertical heating part and the second vertical heating part are independently controlled.

5. The substrate processing apparatus of claim 4, wherein the first control part comprises a first temperature measuring member configured to measure a temperature of the first vertical heating part, and
the second control part comprises a second temperature measuring member configured to measure a temperature of the second vertical heating part and a third temperature measuring member configured to measure an inner temperature of the reaction tube.

6. The substrate processing apparatus of claim 5, wherein the first control part controls the first vertical heating part by using a measured value of the first temperature measuring member, and
the second control part controls the second vertical heating part by using a value calculated by a measured value of the second temperature measuring member and a measured value of the third temperature measuring member.

7. The substrate processing apparatus of claim 1, wherein the plurality of vertical heating parts are formed by stacking a plurality of horizontal heating elements that are independently controlled.

8. The substrate processing apparatus of claim 1, further comprising a rotation driving unit configured to rotate the substrate boat.

9. A substrate processing apparatus comprising:
a substrate boat configured to load a substrate;
a reaction tube in which a processing process for the substrate loaded in the substrate boat is performed;
a gas supply unit configured to supply a process gas into the reaction tube through a plurality of injection nozzles vertically disposed on one side of the reaction tube;
a heating unit divided into a first vertical heating part and a second vertical heating part and disposed along a circumference of the reaction tube to surround the circumference of the reaction tube; and
a control unit configured to control the heating unit,
wherein the first vertical heating part is disposed at a position corresponding to the injection nozzle;
wherein the second vertical heating part extends along the circumference of the reaction tube from one side to the other side of the first vertical heating part,
wherein the first vertical heating part and the second vertical heating part respectively heat a region corresponding to the injection nozzle and other regions having the same height in an inside space of the reaction tube, and
wherein the first vertical heating part has a horizontal cross-sectional area less than that of the second vertical heating part.

10. The substrate processing apparatus of claim 9, wherein the control unit comprises:
a first control part connected to the first vertical heating part; and
a second control part connected to the second vertical heating part, and
wherein the first control part and the second control part respectively control the first vertical heating part and the second vertical heating part so that the region corresponding to the injection nozzle, which has a gas partial pressure greater than the other regions having the same height, has a temperature less than the other regions having the same height.

11. The substrate processing apparatus of claim 9, wherein the first vertical heating part has a heating temperature corresponding to a range from 90% to 110% of a heating temperature of the second vertical heating part.

12. The substrate processing apparatus of claim 10, wherein the first control part comprises a first temperature measuring member configured to measure a temperature of the first vertical heating part, and
wherein the second control part comprises a second temperature measuring member configured to measure a temperature of the second vertical heating part and a third temperature measuring member configured to measure an inner temperature of the reaction tube.

13. The substrate processing apparatus of claim 12, wherein the first control part is configured to control the first vertical heating part by using a measured value of the first temperature measuring member, and wherein the second control part is configured to control the second vertical heating part by using a value calculated by a measured value of the second temperature measuring member and a measured value of the third temperature measuring member.

* * * * *